United States Patent [19]

Matsui et al.

[11] Patent Number: 5,318,651
[45] Date of Patent: Jun. 7, 1994

[54] METHOD OF BONDING CIRCUIT BOARDS

[75] Inventors: Koji Matsui; Mitsuru Kimura; Kazuaki Utsumi, all of Tokyo; Eiichi Ogawa, Kanagawa; Hiroshi Komano, Kanagawa; Toshimi Aoyama, Kanagawa, all of Japan

[73] Assignees: Nec Corporation, Tokyo; Tokyo Ohka Kogyo Co., Ltd., Kanagawa, both of Japan

[21] Appl. No.: 978,720

[22] Filed: Nov. 19, 1992

[30] Foreign Application Priority Data

Nov. 27, 1991 [JP] Japan .................. 3-355398
Jun. 29, 1992 [JP] Japan .................. 4-196255

[51] Int. Cl.⁵ .............................. B32B 31/00
[52] U.S. Cl. .................. 156/273.5; 156/273.3; 156/275.5; 156/275.7; 156/320; 29/830
[58] Field of Search ............. 156/273.3, 273.5, 273.7, 156/275.3, 275.5, 275.7, 273.9; 29/830

[56] References Cited

U.S. PATENT DOCUMENTS

| | | | |
|---|---|---|---|
| 4,157,407 | 6/1979 | Peiffer | 156/273.5 X |
| 4,536,468 | 8/1985 | Yasui et al. | 427/510 X |
| 4,749,120 | 6/1988 | Hatada . | |
| 4,759,490 | 6/1988 | Ochiai | 228/124 |
| 4,880,486 | 11/1989 | Maeda | 156/273.5 |
| 4,916,805 | 4/1990 | Ellrich et al. | 156/273.3 X |
| 4,935,627 | 6/1990 | Zimmermann et al. | 250/338.4 |
| 4,948,706 | 8/1990 | Sugihara et al. | 156/667 X |
| 5,065,505 | 11/1991 | Matsubara et al. | 156/275.5 X |

FOREIGN PATENT DOCUMENTS

| | | |
|---|---|---|
| 0389756 | 10/1990 | European Pat. Off. . |
| 0424106 | 4/1991 | European Pat. Off. . |
| 0493131 | 7/1992 | European Pat. Off. . |
| 3444981 | 6/1985 | Fed. Rep. of Germany . |

OTHER PUBLICATIONS

IBM Technical Disclosure Bulletin, vol. 26, No. 3A, Aug. 1983; Plug and Socket Chip Joining by Jones et al.

Primary Examiner—David A. Simmons
Assistant Examiner—M. Curtis Mayer
Attorney, Agent, or Firm—Sughrue, Mion, Zinn, Macpeak & Seas

[57] ABSTRACT

A method of bonding first and second circuit boards includes applying a light-sensitive adhesive over the first electrodes on a first circuit board and the areas where the first electrodes are not formed, and drying the applied adhesive to form a light-sensitive adhesive layer having the light-sensitive adhesive layer exposed selectively to active rays of light and performing development to remove only the light-sensitive adhesive layer on the first electrodes, and then performing a heat treatment to impart bonding quality to the light-sensitive adhesive layer remaining between adjacent first electrodes, placing the first and second circuit boards one on top of the other and thermocompressing the two circuit boards to have the first electrodes connected electrically to the second electrodes to form a single circuit board; and performing a heat treatment and/or exposure to active rays of light on the formed single circuit board.

1 Claim, 3 Drawing Sheets

METHOD OF BONDING CIRCUIT BOARDS

BACKGROUND OF THE INVENTION

The present invention relates to a method of bonding circuit boards. More particularly, the present invention relates to a method of bonding circuit boards that enables two fine-line patterned electrodes to be connected positively using a light-sensitive adhesive that exhibits bonding quality upon heat treatment.

The present invention also relates to an integrated circuit device connecting method by which fine electrode pads, such as on an LSI, can be connected to electrode terminals on a mounting base.

DESCRIPTION OF THE RELATED ART

Two circuit boards are conventionally bonded together by soldering the electrodes on one circuit board to those on the other. This method, which involves heating solder to melt so that electrodes can be connected together, has the problem that two electrodes will often be shorted if they are formed on a very small pitch on either circuit board. To avoid this thermal disadvantage to circuit boards that are connected by soldering, which is a high-temperature treatment, a different approach has recently been adopted that permits two circuit boards to be bonded together by means of an anisotropic conductive adhesive.

An anisotropic conductive adhesive includes conductive particles dispersed in it that cohere to form agglomerates upon pressure application. The agglomerates exhibit conductivity in the direction of thickness but not in other directions. To make use of this anisotropic nature, a layer of the anisotropic conductive adhesive is formed on the surfaces of two electrodes to be bonded and the intervening adhesive layer is compressed in the direction of its thickness thereby establishing electrical connection between the two electrodes by means of the conductive particles.

More specifically, to achieve connection of the type contemplated by the present invention, anisotropic conductive materials for electrical connection that contain conductive particles are conventionally applied to the surface in such a way that they are thermocompressed at a temperature of ca. 180°-84 200° C. and at a pressure of ca. 20-30 kg/cm$^2$.

The method proceeds as follows. First, as shown in FIG. 5(a), an LSI chip 1 having metal bumps 51 formed on electrode pads 2 is brought to a face-to-face relationship with a base 3 having electrode terminals 4 that are formed in registry with the electrode pads 2. A heat-bonding resin 10 made of an anisotropic conductive material for electrical connection that contains conductive particles 11 is inserted between the LSI chip 1 and the base 3. Then, as shown in FIG. 5(b), the LSI chip 1 is pressed against the base 3 and heated, whereupon the heat-bonding resin 10 is softened so that the electrode pads 2 are connected to the electrode terminals 4 through the aid of conductive particles 11. In certain cases, the metal bumps 51 may be omitted and electrical connection is established only between the electrode pads 2 and the electrode terminals 4 with the conductive particles 11 being disposed therebetween.

Using an anisotropic conductive adhesive, one can establish satisfactory interconnection between electrodes if their pitch is wider than 150 μm. However, if the pitch lo between electrodes is smaller than 150 μm, conductive particles dispersed in the adhesive will produce unwanted conductive paths, which potentially leads to shorting.

The above-described conventional connecting-/mounting method has the problem that if the number of conductive particles 11 which establish electrical connection between the electrode pads 2 and the electrode terminals 4 increases, the chance of the occurrence of shorting or current leakage between adjacent electrode pads or electrode terminals will also increase. If the number of the conductive particles 11 is reduced with a view of avoiding that problem, the connection resistance will not only increase but also fluctuate. In an extreme case, electrically open connections can occur. The recent efforts to further reduce the dimensions of connection have only aggravated these problems. In addition, it is extremely difficult to insure that the LSI chip is pressed against the base with strict parallelness being maintained and, in actual operations, fluctuations will occur in the gap between electrode terminals and, hence, in the number of conductive particles present between electrode terminals, eventually causing inconsistency in the established connections. All these phenomena are serious defects that can lead to unreliable operations of the device.

In order to bond two circuit boards having electrodes of a smaller feature size, a method has been proposed, in which a photocurable adhesive is applied over a circuit board and all areas of the adhesive layer, except those which correspond to the electrodes, are photocured to provide tackiness only on the electrodes, to which conductive particles are deposited. The layer of the conductive particles is coated with a photocurable adhesive and the other circuit board is placed on top of the first circuit board and compressed as the assembly is exposed to light so as to bond the two circuit boards together (see Japanese Laid-Open Publication (Kokai) Hei No. 3-131089). However, even this method is not highly capable of meeting the requirement of recent designs for finer electrode sizes as shorting will often occur if the pitch between electrodes is smaller than 50 μm. Hence, it is strongly desired to develop a more practical method that is capable of bonding two circuit boards effectively even if the inter-electrode size is very small.

SUMMARY OF THE INVENTION

Under the circumstances, the present inventors conducted intensive studies in order to develop an effective method of bonding circuit boards having electrodes arranged on a very small pitch. As a result, the inventors found that the aforementioned object could be attained by bonding two circuit boards, especially by connecting the electrodes on the two circuit boards, with the aid of a light-sensitive adhesive that exhibits bonding quality upon heat treatment. The present invention has been accomplished on the basis of this finding.

Another object, therefore, of the present invention is to provide an integrated circuit device connecting method that insures highly reproducible and consistent connection and which is capable of effectively dealing with fine-line electrode patterns.

The present invention provides a method of bonding two circuit boards by connecting first electrodes on a first circuit board to second electrodes that are formed on a second circuit board at positions that are in registry with said first electrodes, said two circuit boards being placed one on top of the other, which method comprises the steps of:

(1) applying a light-sensitive adhesive over the first electrodes on the first circuit board and the areas where said first electrodes are not formed, and drying the applied adhesive to form a light-sensitive adhesive layer;

(2) having said light-sensitive adhesive layer exposed selectively to active rays of light and performing development to remove only said light-sensitive adhesive layer on said first electrodes, and then performing a heat treatment to impart bonding quality to said light-sensitive adhesive layer remaining between adjacent first electrodes;

(3) placing said first and second circuit boards one on top of the other and thermocompressing the two circuit boards to have said first electrodes connected electrically to said second electrodes; and (4) performing a heat treatment and/or exposure to active rays of light on a single circuit board that consists of said first and second circuit boards and which has said first electrodes connected to said second electrodes.

As a result of the intensive studies conducted in order to attain another object, the present inventors found that the foregoing problems of the prior art could be solved by using a resin capable of curing upon exposure to active energy rays. The present invention has been accomplished under these circumstances.

The present invention provides an integrated circuit connecting method that comprises connecting electrode pads on an integrated circuit device to electrode terminals formed in registry with said electrode pads, which method comprises the steps of:

(1) forming metal bumps on the surface of either the electrode pads or the electrode terminals or both;

(2) covering the surface on either the integrated circuit device side or the base side or both with a resin that cures upon exposure to active energy rays;

(3) patterning said resin by lithography to strip selectively the coating of said resin over the electrode pads or the electrode terminals;

(4) bringing the electrode pads and the electrode terminals into a face-to-face relationship, allowing the metal bumps to contact the opposing electrode pads or electrode terminals and thermocompressing them together so that the coating of said resin will adhere closely to the integrated circuit device or the base while, at the same time, the electrode pads are connected to the electrode terminals with the metal bumps interposed; and (5) performing a heat treatment and/or exposure to active energy rays.

DETAILED DESCRIPTION OF THE PREFERRED EMBODIMENTS

The first embodiment of the present invention is described in detail below.

Figure 1A:
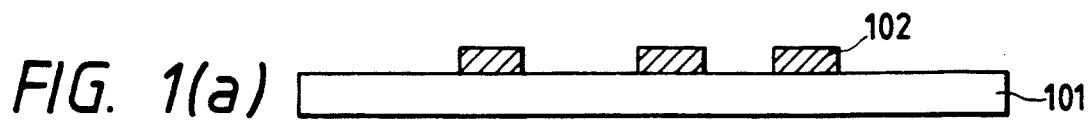
FIGS. 1(a)–(e) show respective first to fifth stages of the bonding method of the present invention.
Figure 1B:
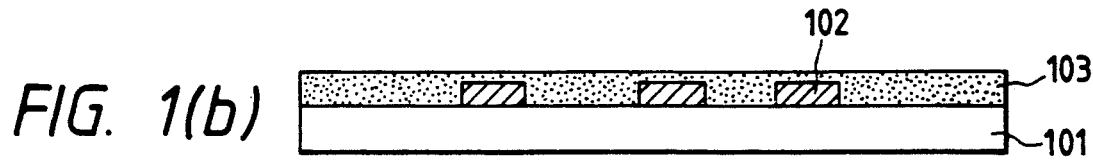
Figure 1C:
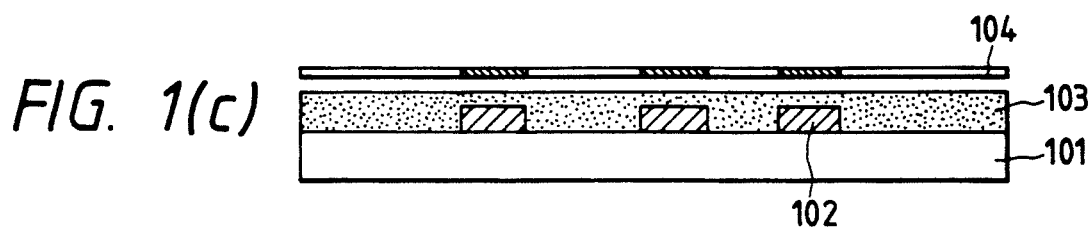
Figure 1D:
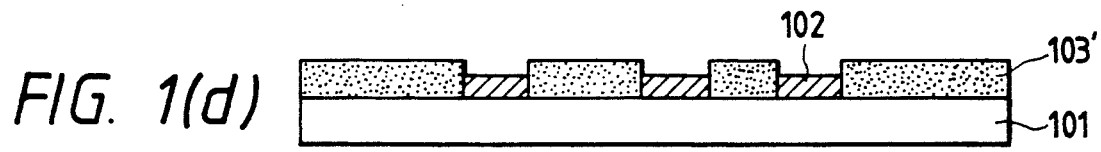
Figure 1E:
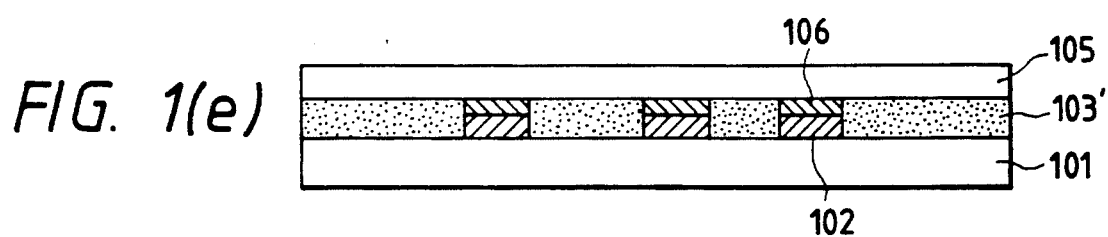

FIG. 1(a) shows the first stage of bonding two circuit boards by the method of the present invention. As shown in FIG. 1(a), a first circuit board is provided that comprises an insulating base 101 such as a semiconductor base, a base for printed-wiring board, a glass base or a ceramic base and which has formed thereon first electrodes 102 that are made of a conductor such as ITO (indium-tin oxide), Ti, Ta, Mo, Ni, Al, Cu, Au, Sn or Pb or an alloy thereof. Subsequently, as shown in FIG. 1(b), a light-sensitive adhesive is applied over the first electrodes 102 and the areas where they are not formed by a suitable coating method such as roll coating, curtain flow coating, screen printing, spray coating or spin coating, and the applied coating is dried to form a light-sensitive adhesive layer 103. Then, as shown in FIG. 1(c), a mask 104 that does not permit the passage of light through areas corresponding to the first electrodes 102 is placed on top of the adhesive layer 103 and active rays of light such as ultraviolet rays are applied through the mask 104. If a transparent base, such as a glass base is used, active rays of light can be applied from the back side. Then, as shown in FIG. 1(d), the unexposed areas of the adhesive layer are stripped with a liquid developer so that a light-sensitive adhesive layer 103' will remain only in the spaces between the first electrodes 102. Thereafter, a heat treatment is conducted to impart bonding quality to said adhesive layer 103'. Subsequently, as shown in FIG. 1(e), a second circuit board is provided that comprises an insulating base 105 such as a semi-conductor base, a base for printed-wiring board, a glass base or a ceramic base and which has formed thereon second electrodes 106 that are in registry with the first electrodes 102 and which are made of a conductor such as Ti, Ta, Mo, Ni, or Al or an alloy thereof. The second circuit board is placed on top of the first circuit board and the two circuit boards are thermocompressed so that the first electrodes 102 are connected to the second electrodes 106. The resulting assembly (single circuit board) is subjected to a heat treatment and/or exposure to active rays of light such as ultraviolet rays, whereby the first circuit board is bonded completely to the second circuit board by means of the light-sensitive adhesive. This process insures a strong bond between two circuit boards and even circuit boards having a very small pitch between electrodes can be bonded together without causing effectively any problem such as shorting.

Any light-sensitive adhesive can be used in the bonding method of the present invention, provided that it cures upon exposure to active rays of light such as ultraviolet rays and that the resulting cured product will exhibit bonding quality upon heat treatment. More specifically, a light-sensitive adhesive can be used that contains an esterified resin and a photo-polymerization initiator, which esterified resin is produced by reacting an unsaturated basic acid with at least one member of the group consisting of a cresol novolak epoxy resin, a phenol novolak epoxy resin, a glycidylamine epoxy resin, a biphenyl epoxy resin and bromine addition products thereof. It is particularly preferred to use a light-sensitive adhesive that contains a photopolymerization initiator and an esterified resin that is produced by reacting an unsaturated basic acid with at least one member selected from between a cresol novolak epoxy resin and a phenol novolak epoxy resin. In this preferred case, the cresol novolak epoxy resin can be prepared by reacting epichlorohydrin or methyl epichlorohydrin with a cresol novolak resin that is formed from cresol and formaldehyde; similarly, the phenol novolak epoxy resin can be prepared by reacting epichlorohydrin or methyl epichlorohydrin with a phenol novolak resin that is formed from phenol and formaldehyde.

Examples of the unsaturated basic acid that reacts with the above-mentioned cresol novolak epoxy resin and/or phenol novolak epoxy resin include acrylic acid, methacrylic acid, crotonic acid, mono-methyl maleate, monopropyl maleate, monobutyl maleate, sorbic acid, etc. These unsaturated basic acids can be used either alone or in combination.

For reaction between the epoxy resins and the unsaturated basic acids, secondary or tertiary amines can be used as esterification catalysts and they include diethylamine hydrochloride, diethylamine acetate and triethylamine.

Exemplary photopolymerization initiators include benzophenones such as benzophenone, 4,4'-dimethylaminobenzophenone and 4,4'-diethylaminobenzophenone, anthraquinones such as 2-ethylanthraquinone and tertbutylanthraquinone, benzoinalkylethers such as benzoinethylether and benzoinisopropylether, as well as 2,2-dimethoxy-2-phenylacetophenone, 2,2-diethoxy-acetophenone, 2-chlorothioxanthone, diethylthioxanthone, 2-hydroxy-2-methylpropiophenone, 4'-iso-propyl-2-hydroxy-2-methylpropiophenone, etc. One or more of these initiators are preferably incorporated in amounts of 2-10 wt % of the esterified resin described above.

The light-sensitive adhesive under discussion must cure upon exposure to active rays of light such as ultraviolet rays whereas the resulting cured product must exhibit bonding quality when it is subjected to a heat treatment. The temperature for the heat treatment to which the cured product is subjected is generally in the range of 50°-100° C., preferably in the range of 65°-90° C. Below 50° C., satisfactory bonding quality cannot be imparted; above 100° C., the cured product cannot give an electrode pattern a desired shape.

For practical purposes, the above-described light-sensitive adhesive is preferably used in the bonding method of the present invention in the form of a coating solution that has said adhesive dissolved in an organic solvent. Such organic solvents can be used either alone or in admixtures and they include ethylene glycol monoethyl ether, ethylene glycol monoethyl ether acetate, ethylene glycol monobutyl ether, ethylene glycol monobutyl ether acetate propylene glycol monomethyl ether, propylene glycol monomethyl ether acetate, methyl ketone, methyl isobutyl ketone, 1,1,1-trichloroethane, trichloro-ethylene, etc.

The applied layer of the light-sensitive adhesive described above is given selective exposure to active rays of light such as ultraviolet rays and, there-after, the unexposed areas of the adhesive layer are stripped by development. Exemplary liquid developers that can be used for development include aqueous solutions of inorganic alkalies such as sodium carbonate and sodium hydroxide, aqueous solutions of organic alkalies such as quaternary ammonium salts and amines, and organic solvents such as trichloroethane, butyl acetate, xylene, ethylene glycol monobutyl ether acetate, etc.

The light-sensitive adhesive described above may optionally contain additives such as compatible resins, colorants (e.g., dyes and pigments) and sur-factants depending on a specific need.

In the bonding method of the present invention, the first and the second circuit boards are placed one on top of the other and thermocompressed to have the first electrodes connected to the second electrodes; thereafter, the assembly is given a heat treatment and/or exposure to active rays of light such as ultra-violet rays, whereby the layer of light-sensitive adhesive layer is cured completely, so that the two circuit boards are thoroughly bonded. The heat treatment following thermocompression is conducted preferably at a temperature in the range of 140°-180° C. If the heating temperature is below 140° C., complete bonding of the two circuit boards cannot be achieved. Above 180° C., there is no problem with bonding quality but, on the other hand, the circuit boards and the electrodes on them will be adversely affected. An effective means of thermocompression is constant heating.

Before connecting the first and second electrodes in the bonding method of the present invention, a conductor such as Au, Sn or In alloy may be deposited on the first or second electrodes so that they can be connected together via said conductor.

In accordance with the method of the first embodiment of the present invention for bonding circuit boards, a light-sensitive adhesive that exhibits bonding quality upon heat treatment is used and a layer of this adhesive is selectively formed between electrodes on one circuit board so that they can be directly connected to the electrodes on the other circuit board. This offers the advantage of achieving electrode connection without regard to the pitch between adjacent electrodes and even circuit boards having an electrode pattern with an inter-electrode pitch less than 50 μm can be easily and positively connected without causing any problem such as shorting. Hence, the bonding method of the present invention will be very effective in practical applications.

The following examples are provided for the purpose of further illustrating the first embodiment of the present invention but are in no way to be taken as limiting.

EXAMPLE 1

The ingredients shown below were mixed to prepare a solution of light-sensitive adhesive:

| | |
|---|---|
| Phenol novolak epoxy acrylate resin having tetrahydrophthalic anhydride added thereto | 7.5 g |
| Cresol novolak epoxy acrylate resin having tetrahydrophthalic anhydride added thereto | 17.9 g |
| Cresol novolak epoxy resin (EPICURON N-673 of Dainippon Ink & Chemicals, Inc.) | 14.4 g |
| Urethane oligomer | 8.3 g |
| 2-Methyl-(4-(methylithio)phenyl)-2-morpholino-1-propane | 1.8 g |
| Diethyl thioxanthone | 1.1 g |
| Propylene glycol monomethyl ether acetate | 49.0 g |

A glass base having an ITO film (0.5 μm thick) pattern that consisted of 25-μm wide electrodes spaced on a pitch of 40 μm was spin coated with the prepared solution of light-sensitive adhesive. The applied coating was dried on a hot plate at 90° C. for 5 min to form a light-sensitive adhesive layer having a thickness of 10 μm.

The light-sensitive adhesive layer was exposed selectively to active rays of light through a mask having light-opaque areas in registry with the ITO film pattern on the glass base, which was thereafter immersed in a 5 wt % aqueous solution of triethanol-amine for 3 min at 25° C., whereby the light-sensitive adhesive layer over the ITO film pattern was selectively dissolved away.

Subsequently, a silicon wafer having an Au pattern formed in registry with the ITO film pattern was superposed on the glass base in such a way that the Au pattern would be connected to the ITO film pattern on the glass base. The glass base and the silicon wafer were thermocompressed by heating at a temperature of 80° C. under application of a pressure of 2.5 kg/cm².

Thereafter, blanket exposure to ultraviolet radiation was applied at an intensity of 3 J/cm² from the glass base side so that the light-sensitive adhesive layer would cure completely to have the glass base bonded thoroughly to the silicon wafer. The resulting single circuit board had the first and second electrodes effectively connected.

EXAMPLE 2

A single circuit board was fabricated by repeating the procedure of Example 1 except that the blanket exposure to ultraviolet radiation from the glass base side was replaced by a heat treatment for 30 minutes in an oven at 150° C. in order to cure the light-sensitive adhesive layers completely. It was verified that the fabricated circuit board also featured effective interconnection of electrodes.

The second embodiment of the present invention is described below in greater detain. As shown in FIG. 1, a metal bump layer made of a conductor such as indium is evaporated or otherwise deposited over either a base 203 having electrode terminals 204 formed thereon or an integrated circuit device 201 having electrode pads 202 formed thereon. A photoresist is coated over the metal bump layer, dried and given exposure through a mask pattern, followed by stripping of the unwanted resist portion. Thereafter, metal bumps 205 are formed on the electrode pads or electrode terminals by a suitable method such as plasma etching or dipping in an etchant.

After providing metal bumps in desired positions, a resin that cures upon exposure to active energy rays is provided on the surface of either the integrated circuit device side or the base side or both and then patterned, for example, by lithography to strip selectively the resin coat over the electrode pads or the electrode terminals.

Metal bumps can be formed of a conductor such as solder, gold, aluminum, indium or ITO (indium-tin oxide); indium which can be fused at comparatively low temperature is used with particular preference.

The resin to be used in the present invention which cures upon exposure to active energy rays may be a resin composition that contains both a resin that is reactive with active energy rays and an initiator of polymerization that is to be initiated by active energy rays.

Any resins can be used as long as they cure upon exposure to active energy rays such as ultraviolet rays, electron beams and X-rays, provided that the cured product should exhibit bonding quality upon heat treatment. Specific examples of resins that can be used with advantage include those which are produced by reacting epoxy groups in phenol novolak epoxy resin, cresol novolak epoxy resins, glycidylamino epoxy resins, biphenyl epoxy resins and bromides thereof (these resins can cure upon exposure to active energy rays) with unsaturated basis acids such as acrylic acid, methacrylic acid, crotonic acid, maleic acid, monomethyl maleate, monopropyl maleate, mono-butyl maleate, sorbic acid, etc. Acrylic acid is particularly preferred as an unsaturated basic acid and it is preferably reacted with epoxy groups in such an amount that the ratio of acid equivalent to epoxy equivalent is in the range of 0.5–1.5.

The thus prepared resin capable of curing upon exposure to active energy rays may be rendered alkali developable by further reaction with a polybasic acid such as phthalic acid, phthalic anhydride, maleic acid, maleic anhydride, oxalic acid, adipic acid or citric acid. In this case, the acid value of the resin is preferably adjusted to 50–150.

The resin component under discussion must cure upon exposure to active energy rays such as ultra-violet rays whereas the resulting cured product must exhibit bonding quality upon heat treatment. The temperature for the heat treatment to which the cured product is subjected is generally in the range of 50°–120° C., preferably in the range of 60°–90° C. Below 50° C., satisfactory bonding quality cannot be imparted; above 120° C., the cured product cannot be given an electrode pattern of desired shape.

An initiator of polymerization to be initiated by active energy rays is one that generates radicals upon exposure to active energy rays and is capable of promoting the polymerization of the resin at issue (i.e., which cures upon exposure to active energy rays) by hydrogen abstraction, radical cleavage, or other reactions that can be caused by the initiator itself. A typical class of initiators that cause hydrogen abstraction are benzophenones. An exemplary class of initiators that cause radical cleavage are benzyldimethyl ketals. Also useful are thioxanthone base compounds. Specific examples of initiators include benzophenone, 4,4′-dimethylaminobenzophenone, 4,4′-diethylaminobenzophenone, 2-ethylantraquinone,tert-butylanthraquinone,benzionethylether, benzo-inisopropyl ether, 2,2-dimethoxy-2-phenylacetophenone, 2,2-diethoxyacetophenone, 2-chlorothioxanthone, diethylthioxanthone, 2-hydroxy-2-methylpropiophenone, 4-isopropyl-2-hydroxy-2-methylpropiophenone, etc. One or more of these compounds are preferably incorporated in amounts of 2–10 wt % of the resin described above which cures upon exposure to active energy rays.

For practical purposes, the resin under discussion is preferably used in the form of a coating solution that has a resin dissolved in an organic solvent. Such organic solvents can be used either alone or in admixtures and they include ethylene glycol monoethyl ether, ethylene glycol monoethyl ether acetate, ethylene glycol monobutyl ether, ethylene glycol monobutyl ether acetate, propylene glycol monomethyl ether, propylene glycol monomethyl ether acetate, methyl ethyl ketone, methyl isobutyl ketone, 1,1,1-trichloroethane, trichloroethylene, etc.

While the resin having the formula described above can be used in the connecting method of the present invention, it may incorporate a softener that will impact softness to the resin so that cracking or other troubles will not occur during thermo-compression, or a bonding quality modifier that controls the temperatures at which bonding quality will develop.

Useful softeners include various monomers and oligomers that are based on acrylates, methacrylates, urethanes, styrenes, etc.

Bonding quality modifiers that can advantageously be used include phenol novolak epoxy resin, cresol novolak epoxy resins and bisphenol A type epoxy resins. Such bonding quality modifiers may be incorporated in amounts of 5-40 wt %, preferably 10-20 wt %, of the solids content of the resin which cures upon exposure to active energy rays. The temperature at which bonding quality develops can be freely controlled by adjusting the content of the modifier within the range set forth above; however, bonding quality develops preferably at 50°-120° C. Above 120° C., the modifier will cure in response to the opening of the epoxy ring, which helps enhance the strength of the resin capable of curing upon exposure to active energy rays.

If a base such as a glass base that is transparent to visible light is used, one or more light-shielding materials may be added in order to prevent the integrated circuit device from operating erroneously under light. Such light-shielding materials can be selected from the group consisting of inorganic pigments such as carbon black, titanium black, iron black, white lead, titanium dioxide, titanium yellow and ultramarine and organic pigments such as azo-, phthalocyanine-, isoinhydrin- and dioxane-base compounds. The light-shielding materials can be added in amounts of 5-40 wt %, preferably 10-30 wt %, of the total components. The specific kind and amount of the light-shielding material to be added should be selected appropriately in such a manner that the bonded and cured resin coat will have a light transmittance less than 5% at a wavelength of 400-700 nm.

Furthermore, the resin capable of curing upon exposure to active energy rays may optionally contain dyes, pigments, polymerization inhibitors, antifoam agents and any other additives that are commonly used in the art.

The connecting method according to the second embodiment of the present invention will proceed by the sequence shown in FIG. 3. First, as shown in FIG. 3(a), a solution having the resin 206 (capable of curing upon exposure to active energy rays) is applied, typically over the base 203 (having electrode terminals 204) by a suitable coating method such as roll coating, curtain flow coating, screen printing, spray coating or spin coating and the applied coating is dried to form a resin layer. Thereafter, as shown in FIG. 3(b), a mask 207 that does not permit the passage of light 208 through areas corresponding to the electrode terminals 204 is placed on top of the resin layer and active energy rays such as ultraviolet rays are applied through the mask 207. If a base such as a glass base that is transparent to active energy rays is used, active energy rays may be applied from the back side. Then, as shown in FIG. 3(c), the unexposed area of the resin layer are stripped with a liquid developer 209 so that the resin layer will remain only in the spaces between electrode terminals 204. For exposure, active energy rays are applied at an intensity of ca. 0.05-0.15 J/cm$^2$ if the resin does not contain a light-shielding material, and ca. 0.3-2.5 J/cm$^2$ if it contains a light-shielding material. If the intensity of active energy radiation is less than 0.05 J/cm$^2$ or 0.3 J/cm$^2$, the exposed areas will not cure to a satisfactory degree. On the other hand, if the radiation intensity exceeds 0.15 J/cm$^2$ or 2.5 J/cm$^2$, the curable component of the resin will cure completely and the resulting difficulty in developing the necessary bonding quality will reduce the process efficiency in subsequent steps.

The patterned layer of the resin which will cure upon exposure to active energy rays is subjected to a heat treatment so as to be given bonding quality. Then, as shown in FIG. 3(d), the integrated circuit device 201 having electrode pads 202 is placed on top of the base 3 in such a way that the electrode pads 202 will be in registry with the electrode terminals 204, with metal bumps 205 being interposed. By subsequent thermocompressing at a temperature of 50°-120° and at a pressure of 1-20 kg/cm$^2$, the resin which will cure upon exposure to active energy rays is bonded to the base 203 or the integrated circuit device 201 while, at the same time, the electrode pads 202 are connected to the electrode terminals 204 with the metal bumps 205 being interposed. In order to insure that the electrode pads or terminals will be connected to the metal bumps more positively, thermocompression may be continued for a few more minutes with the temperature raised to 120°-180° C.

Figure 3A:
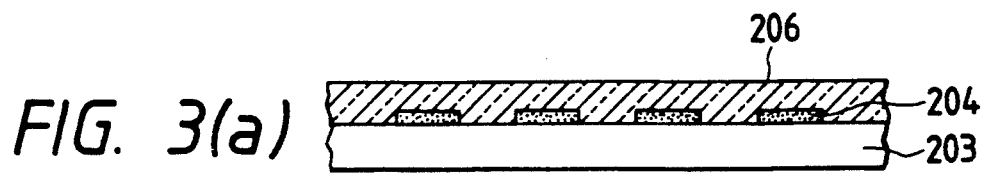
FIGS. 3(a)–3(e) show cross section views of the subsequent steps of the LSI connecting method.
Figure 3B:
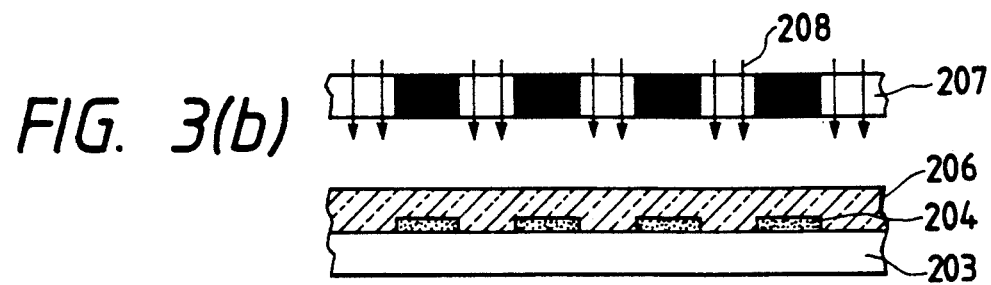
Figure 3C:
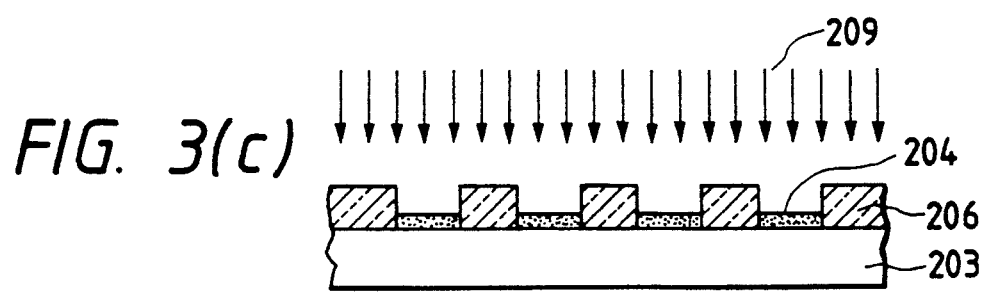
Figure 3D:
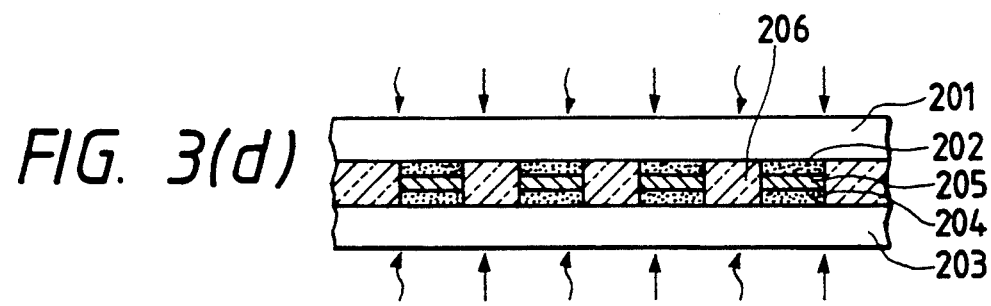
Figure 3E:
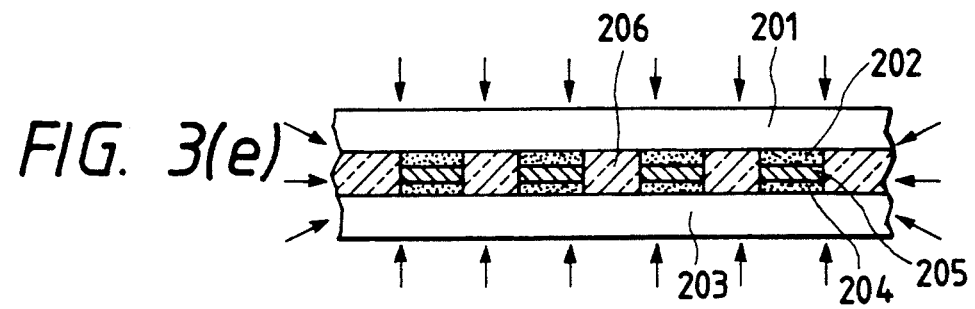
Figure 4:
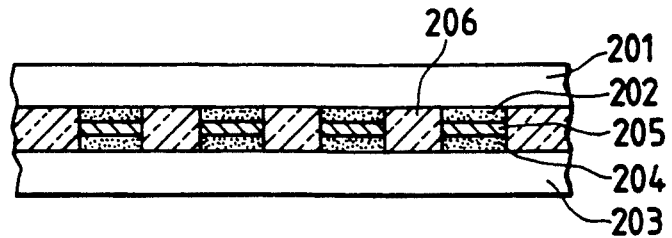
FIG. 4 is a cross section view of a device constructed by the method of the present invention.
Figure 5A:
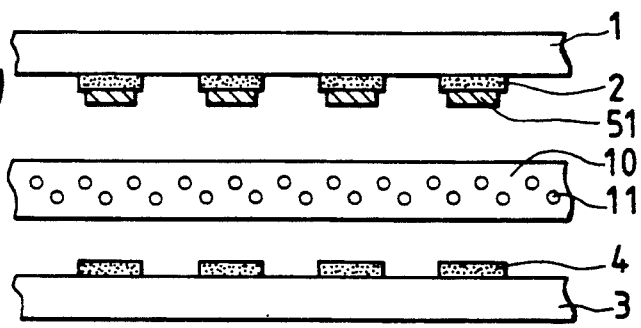
FIGS. 5(a)–5(b) show cross section views of successive steps of a conventional LSI chip connecting method.
Figure 5B:
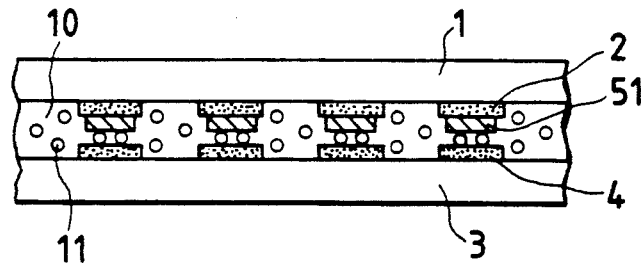

Thereafter, the assembly is heated at a temperature of 120°-200° C. or, as shown in FIG. 3(e), and exposed to active energy rays such as ultraviolet rays at an intensity of 1-5 J/cm$^2$, whereby the resin cures completely to achieve the necessary bonding. As a result, bonding or connection is established not only between the electrode terminals and pads with the metal bumps interposed, but also between the base or the integrated circuit device and the resin which is capable of curing upon exposure to active energy rays. Hence, strong bonding quality is imparted and even fine-line electrode patterns can be connected effectively without causing any problem such as shorting.

The result will cure satisfactorily even if it is treated with active energy rays or heat alone; however, the cure time can be shortened by applying both active energy rays and heat. If the heating temperature is below 120° C., the curing of the resin will not start. Above 200° C., the resin will flow due to excessive heat and a desired electrode pattern cannot be produced. Furthermore, the base and electrodes will be adversely affected.

Because of the features described above, the present invention provides an LSI chip connecting method that insures highly reproducible, consistent and reliable connection and which is capable of dealing with fine-line electrode patterns.

Electrode pads are connected to electrode terminals with metal bumps being interposed while an integrated circuit device is bonded to a base using a resin that cures upon exposure to active energy rays, thus insuring positive electrode connection while reducing the possible variations in connection resistance. If the base is transparent to visible light, the resin that will cure upon exposure to active energy rays may be adjusted to have a light transmittance less than 5% at a wavelength of 400-700 nm and this enables an LSI from operating erroneously under light even if it is not shielded from light.

The following examples are provided for the purpose of further illustrating the second embodiment of the present invention but are in no way to be taken as limiting.

EXAMPLE 3

Figure 2:
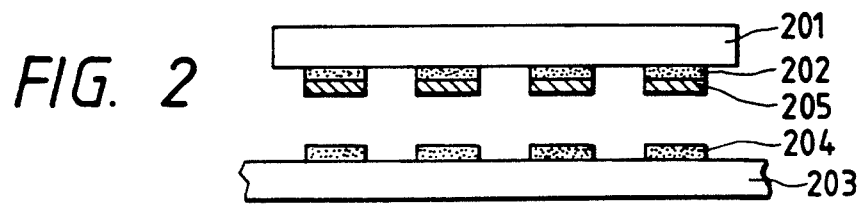
FIG. 2 is a cross section view showing the first step of an LSI connecting method according to the present invention.

The present invention is described below with reference to accompanying drawings. FIGS. 2 and 3 (a)-(e)

are cross sections showing the sequence of steps for connecting an LSI chip to a base in an example of the present invention. FIG. 2 shows the first step and FIGS. 3(a)–(e) show the subsequent steps. First, with reference to FIG. 2, an integrated circuit device 201 (hereunder referred to as an "LSI chip") was fabricated that had electrode pads 202 formed on the surface, each pad being made of a three-layered (Au/Cr/Al) metal film (Au, Cr and Al layers having thicknesses of 1.0 $\mu$m, 0.05 $\mu$m and 0.5 $\mu$m, respectively) or a three-layered (Au/TiN/Al) metal film (Au, TiN and Al layers having thicknesses of 0.8 $\mu$m, 0.08 $\mu$m and 0.2 $\mu$m, respectively). The base 203 had electrode terminals 204 formed on the surface in registry with the electrode pads 202. In Example 1, metal bumps 205 were integrally formed on the electrode pads 202. The metal bumps 205 are typically made of In (indium) metal but if there is a need to control the melting temperature, alloys of indium and other metals such as lead may be employed.

In the next step, as shown in FIG. 3(a), a solution of a resin capable of curing upon exposure to active energy rays was spin-coated or otherwise applied uniformly onto the base 203 and dried to form a resin layer 206. The resin solution was prepared by mixing the following components.

| | |
|---|---|
| Phenol novolak epoxy acrylate resin having tetrahydrophthalic anhydride added thereto | 9.0 g |
| Cresol novolak epoxy acrylate resin having tetrahydrophthalic anhydride added thereto | 14.0 g |
| Cresol novolak epoxy resin | 12.9 g |
| Urethane oligomer | 6.5 g |
| 2-Methyl-(4-(methylthio)phenyl)-2-morpholino-1-propane | 6.4 g |
| Diethylthioxanthone | 3.2 g |
| Propylene glycol monomethyl ether acetate | 34.0 g |

Then, as shown in FIG. 3(b), the resin layer 206 was exposed to active energy rays (uv radiation) 208 through a photomask 207.

In the next step shown in FIG. 3(c), the resin layer was treated with a liquid developer 209 that was a 5% aqueous solution of triethanolamine, whereby the part of resin layer over the electrode terminals 204 was removed to prepare a mask pattern.

Then, as shown in FIG. 3(d), the LSI chip 1 was placed on top of the base 203 preheated to 80° C., with the metal bumps 205 being in registry with the electrode terminals 204. As the metal bumps 205 were brought into contact with the electrode terminals 204, a load of 5 kg/cm² was applied to have the resin layer 206 bonded to the base 203 while, at the same time, the LSI chip 201 was compressed against the electrode terminals 204 with the metal bumps 205 being interposed. To provide stronger connection, the assembly was heated at 150° C. for 2 min with a load of 5 kg/cm² being applied. As a result, the metal bumps 205 melted and adhered firmly to the electrode terminals 204.

Finally, as shown in FIG. 3(e), the assembly was given blanket exposure to uv rays at an intensity of 3 J/cm², whereby the resin cured to have the LSI chip 201 bonded securely to the base 203 while, at the same time, the areas joined by metal bumps were fixed. The completed device shown in FIG. 3(e) did not have any defects, such as incomplete connection or shorting between the LSI chip and the base.

EXAMPLE 4

The connecting procedure of Example 1 was repeated except that a resin capable of curing upon exposure to heat and light was coated onto the LSI chip 201, not the base 203. The completed device was as satisfactory as what was obtained in Example 1.

EXAMPLE 5

The procedure of Example 1 was repeated excepts that the blanket exposure to ultraviolet rays was replaced by a heat treatment for 15 min in an oven at 150° C. in order to cure the resin capable of curing upon exposure to active energy rays. The completed device did not have any defects, such as incomplete connection or shorting between electrodes.

EXAMPLE 6

The procedure of Example 1 was repeated except that the blanket exposure to ultraviolet rays was replaced by blanket exposure to ultraviolet rays at an intensity of 1 J/cm² on a hot plate at 150° in order to cure the resin capable of curing upon exposure to active energy rays. The completed device was as satisfactory as what was obtained in Example 1.

EXAMPLE 7

The connecting procedure of Example 1 was repeated except that a glass base was used and that 14.0 of CF black (pigment produced by Mikuni Shikiso K. K.) was added as a light-shielding component to the recipe for the resin capable of curing upon exposure to active energy rays. The completed device did not have any defects such as incomplete connection or shorting between the LSI chip and the base. The device was assembled into an electronic apparatus and put to service as the entire surface of the device was kept illuminated with light from a white fluorescent lamp; and a single case of erroneous operations occurred on account of such factors as photoelectric effect.

As described above, the chip connecting method of the second embodiment of the present invention does not depend on conductive particles dispersed in and adhesive resin and, hence, unlike the prior art method, fine-line electrode patterns can be connected in a positive, easy and reliable way. Furthermore, metal bumps are provided directly on either electrode pads on an LSI chip or electrode terminals on a base and this not only insures positive connection but also helps reduce the possible variations of connection resistance. If the base is transparent to visible light, a light-shielding material maybe incorporated in the resin which is capable of curing upon exposure to active energy rays. An advantage of this alternative method is that even if the LSI itself is not shielded from light by some means, it is possible to prevent the LSI form operating erroneously under light.

What is claimed is:

1. A method of bonding circuit boards by connecting first electrodes on a first circuit board to second electrodes on a second circuit board at positions that are in registry with said first electrodes, said two circuit boards being placed one on top of the other, the method comprising the steps of:

applying a light-sensitive adhesive over the first electrodes on the first circuit board and over the areas where said first electrodes are not formed, and drying the applied adhesive to form a light-sensitive adhesive layer;

selectively exposing and light-sensitive adhesive layer over said areas where said first electrodes are not formed to active rays of light and removing only that portion of said light-sensitive adhesive layer that is disposed on said first electrodes, and then performing a heat treatment to impact bonding quality to said light-sensitive adhesive layer remaining between adjacent first electrodes;

placing said first and second circuit boards on top of each other and thermocompressign the two circuit boards so that said first electrodes are electrically connected to said second electrodes, thereby forming a single circuit board; and performing at least one of the treatment and exposure to active rays of light on the formed single circuit board.

* * * * *